United States Patent
Bringivijayaraghavan

(10) Patent No.: US 9,111,599 B1
(45) Date of Patent: Aug. 18, 2015

(54) MEMORY DEVICE

(71) Applicant: NANYA TECHNOLOGY CORPORATION, Tao-Yuan Hsien (TW)

(72) Inventor: Venkatraghavan Bringivijayaraghavan, Tamilnadu (IN)

(73) Assignee: NANYA TECHNOLOGY CORPORATION, Taoyuan (TW)

( * ) Notice: Subject to any disclaimer, the term of this patent is extended or adjusted under 35 U.S.C. 154(b) by 0 days.

(21) Appl. No.: 14/300,238

(22) Filed: Jun. 10, 2014

(51) Int. Cl.
*G11C 7/00* (2006.01)
*G11C 7/10* (2006.01)
*G11C 7/22* (2006.01)

(52) U.S. Cl.
CPC .............. *G11C 7/109* (2013.01); *G11C 7/106* (2013.01); *G11C 7/22* (2013.01); *G11C 7/1072* (2013.01); *G11C 7/1093* (2013.01); *G11C 7/227* (2013.01)

(58) Field of Classification Search
CPC .......... G11C 7/22; G11C 7/222; G11C 7/227; G11C 7/1093; G11C 7/1072
USPC ................ 365/191, 193, 194, 189.05, 230.08
See application file for complete search history.

(56) References Cited

U.S. PATENT DOCUMENTS

| | | | | |
|---|---|---|---|---|
| 6,492,852 B2 * | 12/2002 | Fiscus | ........................... | 327/158 |
| 6,691,214 B1 * | 2/2004 | Li et al. | ........................ | 711/167 |
| 7,088,156 B2 * | 8/2006 | Kim | ............................. | 327/149 |
| 7,209,396 B2 * | 4/2007 | Schnell | ......................... | 365/193 |
| 7,250,801 B2 * | 7/2007 | Minzoni | ....................... | 327/175 |
| 7,580,301 B2 * | 8/2009 | Cheng | ........................... | 365/194 |
| 7,656,745 B2 * | 2/2010 | Kwak | ......................... | 365/233.1 |
| 7,872,924 B2 * | 1/2011 | Ma | ........................... | 365/189.05 |
| 8,188,781 B1 * | 5/2012 | Lee | ................................. | 327/264 |
| 8,207,768 B2 * | 6/2012 | Booth et al. | .................... | 327/156 |
| 8,913,448 B2 * | 12/2014 | Tamlyn et al. | ................ | 365/193 |
| 8,928,376 B2 * | 1/2015 | Kwak | ............................ | 327/158 |
| 9,001,594 B2 * | 4/2015 | Bringivijayaraghavan | | 365/189.05 |
| 2006/0197566 A1 * | 9/2006 | Jakobs et al. | ................. | 327/158 |

* cited by examiner

*Primary Examiner* — Viet Q Nguyen
(74) *Attorney, Agent, or Firm* — CKC & Partners Co., Ltd.

(57) ABSTRACT

A memory device including a training circuit, a data strobe transmission path, data transmission paths, data latching circuits and a phase detection circuit is provided. When the memory device is under a training mode, a training process is performed on at least one of the data transmission paths. The phase detection circuit detects a phase difference between signals between the data transmission path and the data strobe transmission path to adjust a delay time of the adjustable delay circuit of the data transmission path until the signals are in phase. When the memory device is under an operation mode, each of the data latching circuits receives a treed data strobe signal from the data strobe transmission path to latch a delayed data signal received from the adjustable delay circuit of one of the data transmission paths.

13 Claims, 2 Drawing Sheets

MEMORY DEVICE

BACKGROUND

1. Field of Invention

The present invention relates to data storage technology. More particularly, the present invention relates to a memory device.

2. Description of Related Art

Memory modules like double data rate (DDR) synchronous dynamic random access memory (SDRAM) are a class of memory capable of providing approximately twice the bandwidth of single data rate SDRAM. DDR SDRAM achieves this increased bandwidth without requiring an increased clock frequency by transferring data on both rising and falling edges of a clock signal. Therefore, the DDR SDRAM is often used in the design of integrated circuits.

In a typical memory device mentioned above, the data is transmitted by utilizing data signal DQ and data strobe signal DQS. However, the path for transmitting the data signal and the path for transmitting the data strobe signal induce variable latencies. It is not easy for the data latching circuit to latch the signal at the right timing when there is difference between the arrival of the data signal and the data strobe signal.

Accordingly, what is needed is a memory device to address the issues mentioned above.

SUMMARY

An aspect of the present invention is to provide a memory device. The memory device includes a training circuit, a data strobe transmission path, a plurality of data transmission paths, a plurality of data latching circuits and a phase detection circuit. The data strobe transmission path includes a first input path and a tree circuit. The first input path has a first input connected to the training circuit and an external data strobe signal source. The tree circuit is connected to a first output of the first input path. Each of the data transmission paths includes a second input path and an adjustable delay circuit. The second input path has a second input connected to an external data signal source, and the second input of the second input path of at least one of the data transmission paths is further connected to the training circuit. The adjustable delay circuit is connected to a second output of the second input path. Each of the data latching circuits is connected to outputs of the adjustable delay circuit of one of the data transmission paths and the tree circuit. The phase detection circuit is connected to the outputs of the adjustable delay circuit of at least one of the data transmission paths and the tree circuit. When the memory device is under a training mode, a training process is performed on at least one of the data transmission paths such that the training circuit is activated to generate a training clock signal to both of the first input path and the second input path and further to the tree circuit and the adjustable delay circuit to generate a first clock signal and a second clock signal respectively, wherein the phase detection circuit detects a phase difference between the first clock signal and the second clock signal to adjust a delay time of the adjustable delay circuit until the first clock signal and the second clock signal are in phase. When the memory device is under an operation mode, the training circuit is deactivated such that the first input path receives an external data strobe signal to generate a data strobe signal to the tree circuit and the second input path receives an external data signal to generate a data signal to the adjustable delay circuit, wherein each of the data latching circuits receives a treed data strobe signal from the tree circuit to latch a delayed data signal received from the adjustable delay circuit of one of the data transmission paths.

Another aspect of the present invention is to provide a memory device that includes a training circuit, a data strobe transmission path, a plurality of data transmission paths, a plurality of data latching circuits and a plurality of phase detection circuits. The data strobe transmission path includes a first input path having a first input connected to the training circuit and an external data strobe signal source. Each of the data transmission paths includes a second input path and an adjustable delay circuit. The second input path has a second input connected to the training circuit and an external data signal source. The adjustable delay circuit is connected to a second output of the second input path. Each of the data latching circuits is connected to an output of the adjustable delay circuit of one of the data transmission paths and a first output of the first input path in series. Each of the phase detection circuit is connected to the adjustable delay circuit of one of the data transmission paths and each disposed in a straight path formed by connecting the phase detection circuits and an output of the second input path in series. When the memory device is under a training mode, a training process is performed on each of the data transmission paths such that the training circuit is activated to generate a training clock signal to the first input path to generate a first clock signal and to the second input path and further to the adjustable delay circuit to generate a second clock signal, wherein each of the phase detection circuit detects a phase difference between the first clock signal received from the straight path and the second clock signal received from the adjustable delay circuit of one of the data transmission paths to adjust a delay time of the adjustable delay circuit until the first clock signal and the second clock signal are in phase. When the memory device is under an operation mode, the training circuit is deactivated such that the first input path receives an external data strobe signal to generate a data strobe signal and the second input path receives an external data signal to generate a data signal to the adjustable delay circuit, wherein each of the data latching circuits receives a passed data strobe signal from the first output of the first input path to latch a delayed data signal received from the adjustable delay circuit.

These and other features, aspects, and advantages of the present invention will become better understood with reference to the following description and appended claims.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
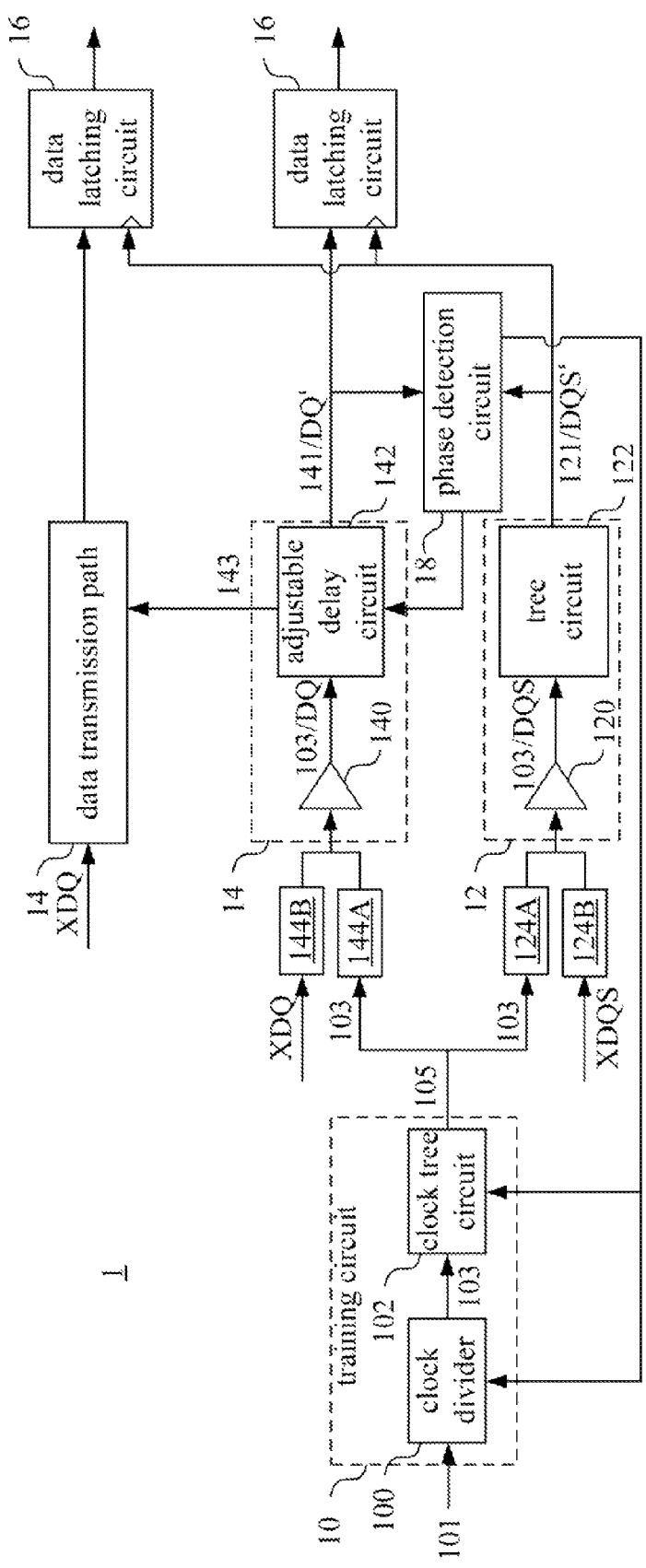
FIG. 1 is a block diagram of a memory device in an embodiment of the present invention.

Reference will now be made in detail to the present embodiments of the invention, examples of which are illustrated in the accompanying drawings. Wherever possible, the same reference numbers are used in the drawings and the description to refer to the same or like parts.

FIG. 1 is a block diagram of a memory device 1 in an embodiment of the present invention. The memory device 1 includes a training circuit 10, a data strobe transmission path 12, a plurality of data transmission paths 14, a plurality of data latching circuits 16 and a phase detection circuit 18.

In an embodiment, the training circuit 10 includes a clock divider 100 and a clock tree circuit 102.

The data strobe transmission path 12 includes a first input path and a tree circuit 122. In the present embodiment, the first input path includes a receiver 120. In other embodiments, the first input path may include an amplifier instead of the receiver or may include other components.

A first input of the first input path, i.e. the input of the receiver 120, is connected to the training circuit 10 and an external data strobe signal source (not illustrated) to either receive the divided clock signal 103 from the training circuit 10, or receive an external data strobe signal XDQS from the external data strobe signal source.

In an embodiment, the receiver 120 is connected to the training circuit 10 and the external data strobe signal source through pass gates 124A and 124B respectively.

The tree circuit 122 is connected to a first output of the first input path, i.e. the output of the receiver 120 to tree the signal received from the receiver 120 to each of the data latching circuits 16. In an embodiment, the tree circuit 122 includes a buffer, an inverter, a delay component or a combination of the above.

In FIG. 1, two data transmission paths 14 are illustrated and the detail components included in one of them is clearly illustrated. However, in other embodiments, the number of the data transmission paths 14 can be different, and the components in each of the data transmission paths 14 can be the same.

Each of the data transmission paths 14 includes a second input path that includes a receiver 140 and an adjustable delay circuit 142. Similar to condition in the data strobe transmission path 12, the second input path may include an amplifier instead of the receiver 140 or may include other components.

A second input of the second input path, i.e. the input of the receiver 140, of each the data transmission paths 16 is connected to an external data signal source (not illustrated). In an embodiment, the second input of the second input path of only one of the data transmission paths 16 is also connected to the training circuit 10 to either receive the divided clock signal 103 from the training circuit 10, or receive an external data signal XDQ from the external data signal source. In an embodiment, the data transmission path 16 that is connected to the training circuit is the one of the data transmission paths 16 that is geometrically closest to the data strobe transmission path 12.

It is noted that in an embodiment, each one of the data latching circuits 16 is connected to the one of the other data latching circuits 16 through its corresponding data transmission path 14 to form a series of data latching circuits 16. Therefore, the external data signal source connected to one of the data transmission path 14 that corresponds to one of the data latching circuits can be one of the other data latching circuits 16.

In an embodiment, the receiver 140 is connected to the training circuit 10 and the external data strobe signal source through pass gates 144A and 144B respectively.

The adjustable delay circuit 142 is connected to a second output of the second input path, i.e. the output of the receiver 140 to delay the signal received from the receiver 140.

Each of the data latching circuits 16 is connected to outputs of the adjustable delay circuit 142 of one of the corresponding data transmission path 14 and the tree circuit 122.

The phase detection circuit 18 is connected to the outputs of the adjustable delay circuit 142 of one of the data transmission paths 14 and the tree circuit 122.

The operation of the memory device 1 is described below.

When the memory device 1 is under a training mode, a training process is performed on one of the data transmission paths 14 that is connected to training circuit 10.

The training circuit 10 is activated. The clock divider 100 receives a source clock signal 101 to generate a divided clock signal 103, in which the frequency of the divided clock signal is 1/N of the frequency of the source clock signal 101, N being an integer. In different embodiments, the number N is different according to practical requirements. Moreover, in an embodiment, the source clock signal 101 is a system clock signal.

The clock tree circuit 102 receives the divided clock signal 103 from the clock divider 100 to generate a training clock signal 105 and trees the training clock signal 105 to subsequent circuits in the memory device 1.

The pass gates 124A and 144A are enabled and the pass gates 124B and 144B are disabled such that the training clock signal 105 is transmitted to the first input path of the data strobe transmission path 12 and the second input path of the data transmission path 14.

The receiver 120 in the first input path transmits the training clock signal 105 to the tree circuit 122 to generate a first clock signal 121. The receiver 140 in the second input path transmits the training clock signal 105 to the adjustable delay circuit 142 to generate a second clock signal 141.

The phase detection circuit 18 detects a phase difference between the first clock signal 121 and the second clock signal 141 to adjust a delay time of the adjustable delay circuit 142 until the first clock signal 121 and the second clock signal 141 are in phase.

In an embodiment, the adjustable delay circuit 142 may include an inverter chain (not illustrated), a phase mixer (not illustrated) or a combination of the above. The phase detection circuit 18 can either control the inverter chain to perform coarse delay or control the phase mixer to perform fine delay. In other embodiments, the adjustable delay circuit 142 may include other delay elements.

Under the training mode, when the phase detection circuit 18 detects that the first clock signal 121 and the second clock signal 141 are in phase, the phase detection circuit 18 deactivates the training circuit 10. In an embodiment, when the first clock signal 121 and the second clock signal 141 are in phase, the phase detection circuit 18 itself is deactivated too. On the contrary, when the phase detection circuit 18 detects the phase difference between that the first clock signal 121 and the second clock signal 141, the phase detection circuit 18 keeps itself being activated and further keeps activating the training circuit 10.

In an embodiment, a sum of a total delay time related to the first input path and the tree circuit 122, a delay time of the phase detection circuit 18 and a delay-adjusting time is smaller than a time period of the training clock signal 105. The source clock signal 101 is sent through the clock divider 100 to achieve this low frequency (i.e. large time period). The reason for a low frequency clock is to ensure that at each edge of the low frequency clock an adjustment can be made after the phase detection.

In the present embodiment, since the training process is performed on only one of the data transmission paths 14, the value 143 of the delay time that makes the first clock signal 121 and the second clock signal 141 in phase is propagated to the adjustable delay circuit 142 in the other data transmission paths 14.

On the other hand, when the memory device 1 is under an operation mode, the training circuit 10 is deactivated.

The pass gate 124A is disabled and the pass gate 124B is enabled. Accordingly, the first input path, i.e. the receiver 120, receives the external data strobe signal XDQS to generate a data strobe signal DQS to the tree circuit 122 such that the tree circuit 122 further trees the data strobe signal DQS to the data latching circuits 16 such that each of the data latching circuits 16 receives a treed data strobe signal DQS'.

The pass gate 144A is disabled and the pass gate 144B is enabled. Accordingly, the second input path, i.e. the receiver 140, receives an external data signal XDQ to generate a data signal DQ to the adjustable delay circuit 142. The data latching circuit 16 receives the treed data strobe signal DQS' from the tree circuit 122 to latch the delayed data signal DQ' received from the adjustable delay circuit 142.

Accordingly, since the value of the delay time of the adjustable delay circuit 142 of the data transmission path 14 is adjusted in the training mode, the treed data strobe signal DQS' arrive each of the data latching circuits 16 at the same time such that each of the data latching circuits 16 latches the corresponding delayed data signal DQ' simultaneously. In an embodiment, the difference between the arrival time of the treed data strobe signal DQS' and the delayed data signal DQ' is less than 10 ps once the adjust adjustable delay circuit 142 is trained.

Consequently, the adjustable delay circuit 142 is used to adjust the delay time such that the delayed data signal DQ and the treed data strobe signal DQS' arrive the data latching circuit 16 at the same time. As compared to the method of disposing a mock tree circuit to connect to the first input path to accomplish the same delay effect, the adjustable delay circuit 142 consumes less power.

In an embodiment, the memory device 1 may include a multiple of phase detection circuits 18 each corresponding to one of the data transmission paths 14. The training process is performed on each of the data transmission paths 14 by using the method described above. Though the multiple of phase detection circuits 18 consume more power, the training result is more accurate to the individual adjustable delay circuit 142.

Figure 2:
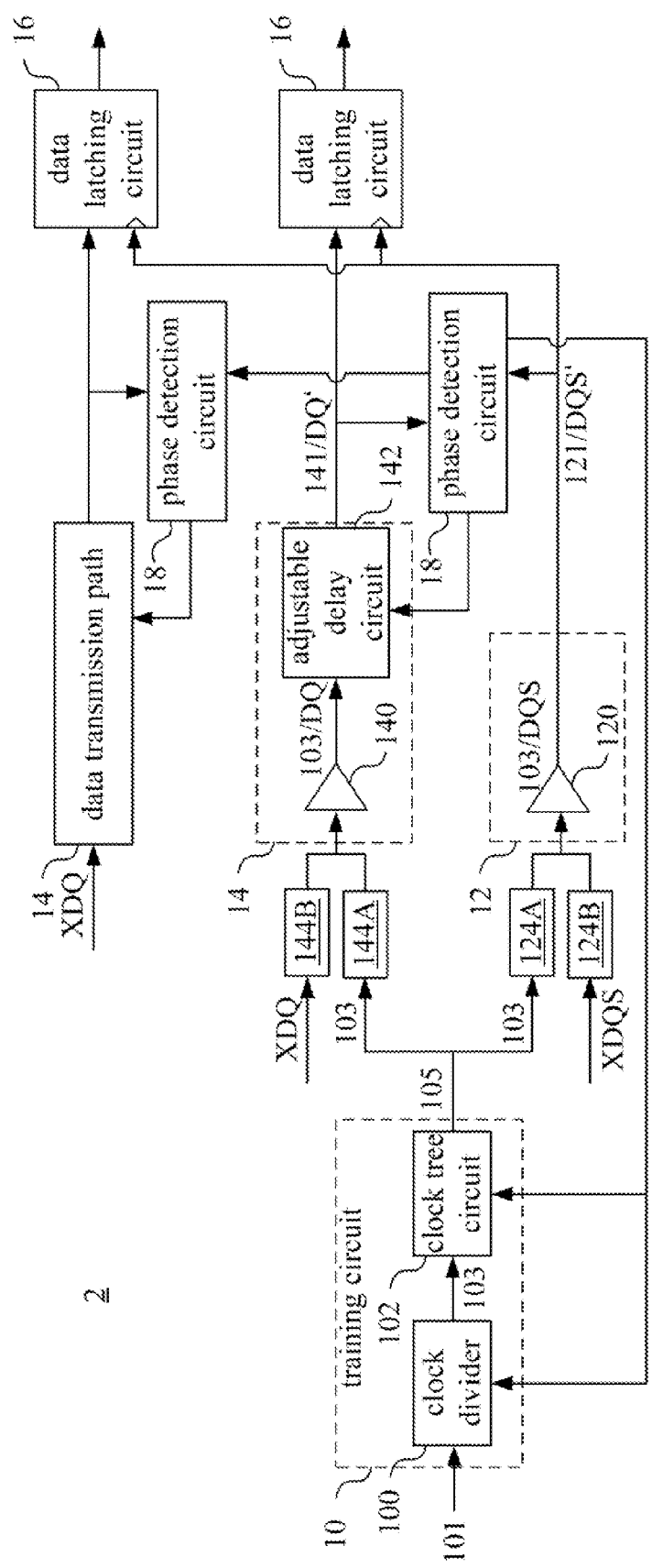
FIG. 2 is a block diagram of a memory device in an embodiment of the present invention.

FIG. 2 is a block diagram of a memory device 2 in an embodiment of the present invention.

Similar to the memory device 1 illustrated in FIG. 1, the memory device 2 includes a training circuit 10, a data strobe transmission path 12, a plurality of data transmission paths 14 and a plurality of data latching circuits 16. In FIG. 2, the memory device 2 further includes a plurality of phase detection circuits 18.

In FIG. 2, two data transmission paths 14 are illustrated and the detail components included in one of them is clearly illustrated. However, in other embodiments, the number of the data transmission paths 14 can be different, and the components in each of the data transmission paths 14 can be the same.

The operation and the components included in the training circuit 10, the data transmission paths 14 and the data latching circuits 16 are substantially the same as those illustrated in FIG. 1, therefore no more detail is discussed herein. In the present embodiment, the data strobe transmission path 12 only includes the first input path that includes the receiver 120. The tree circuit 122 illustrated in FIG. 1 is absent in the embodiment shown in FIG. 2.

Each of the data latching circuits 16 in the present embodiment is corresponding to the adjustable delay circuit 142 of one of the data transmission paths 14 and the output of the first input path.

Each of the phase detection circuits 18 in the present embodiment is connected to the adjustable delay circuit 142 of one of the data transmission paths 14. Moreover, each of the phase detection circuits 18 is disposed in a straight path formed by connecting the phase detection circuits 18 and an output of the second input path in series.

Accordingly, when the memory device 1 is under the training mode, the training process is performed on each of the data transmission paths 14.

Since the data strobe transmission path 12 only includes the first input path that includes the receiver 120, the first clock signal 121 is generated by simply transmitting the divided clock signal 103 through the receiver 120. The first clock signal 121 is further transmitted to the phase detection circuits 18 in the straight path.

Each of the phase detection circuit 18 detects the phase difference between the first clock signal 121 received from the straight path and the second clock signal 141 received from the adjustable delay circuit 142. The phase detection circuit 18 further adjusts the delay time of the adjustable delay circuit 142 until the first clock signal 121 and the second clock signal 141 are in phase.

When the memory device 1 is under the operation mode, the training circuit 10 is deactivated. The first input path, i.e. the receiver 120, receives the external data strobe signal XDQS to generate the data strobe signal XDQ. The second input path, i.e. the receiver 140, receives the external data signal XDQ to generate the data signal DQ to the adjustable delay circuit 142. Each of the data latching circuits 16 receives a passed data strobe signal DQS' from the data strobe transmission path 12 to latch a delayed data signal DQ' received from the adjustable delay circuit 142.

In the present embodiment, since the adjustable delay circuit 142 in each of the data transmission path 14 is individually trained, the value of the delay time can be different for the adjustable delay circuit 142 in each of the data transmission path 14. In such a case, the treeing circuit is unnecessary. So the tree power of the data strobe signal DQS is very low.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A memory device, comprising:
   a training circuit;
   a data strobe transmission path comprising:
      a first input path having a first input connected to the training circuit and an external data strobe signal source; and
      a tree circuit connected to a first output of the first input path;
   a plurality of data transmission paths each comprising:
      a second input path having a second input connected to an external data signal source, and the second input of the second input path of at least one of the data transmission paths is further connected to the training circuit; and
      an adjustable delay circuit connected to a second output of the second input path;

a plurality of data latching circuits each connected to outputs of the adjustable delay circuit of one of the data transmission paths and the tree circuit;

a phase detection circuit connected to the outputs of the adjustable delay circuit of at least one of the data transmission paths and the tree circuit; and wherein when the memory device is under a training mode, a training process is performed on at least one of the data transmission paths such that the training circuit is activated to generate a training clock signal to both of the first input path and the second input path and further to the tree circuit and the adjustable delay circuit to generate a first clock signal and a second clock signal respectively, wherein the phase detection circuit detects a phase difference between the first clock signal and the second clock signal to adjust a delay time of the adjustable delay circuit until the first clock signal and the second clock signal are in phase;

wherein when the memory device is under an operation mode, the training circuit is deactivated such that the first input path receives an external data strobe signal to generate a data strobe signal to the tree circuit and the second input path receives an external data signal to generate a data signal to the adjustable delay circuit, wherein each of the data latching circuits receives a treed data strobe signal from the tree circuit to latch a delayed data signal received from the adjustable delay circuit of one of the data transmission paths.

2. The memory device of claim 1, wherein the training circuit comprises:

a clock divider to receive a source clock signal to generate a divided clock signal; and a clock tree circuit to receive the divided clock signal to generate the training clock signal.

3. The memory device of claim 2, wherein the source clock signal is a system clock signal.

4. The memory device of claim 2, wherein a sum of a total delay time related to the first input path and the tree circuit, a delay time of the phase detection circuit and a delay-adjusting time is smaller than a time period of the training clock signal.

5. The memory device of claim 1, wherein when the memory device is under the training mode, the phase detection circuit deactivates the training circuit when the phase detection circuit detects that the first clock signal and the second clock signal are in phase and keeps activating the training circuit when the phase detection circuit detects the phase difference between that the first clock signal and the second clock signal.

6. The memory device of claim 1, wherein the phase detection circuit is deactivated after the phase detection circuit detects that the first clock signal and the second clock signal are in phase.

7. The memory device of claim 1, wherein the training process is performed on only one of the data transmission paths that is geometrically closest to the data strobe transmission path and a value of the delay time of the adjustable delay circuit that makes the first clock signal and the second clock signal in phase is propagated to the adjustable delay circuit of the other data transmission paths.

8. The memory device of claim 1, wherein the training process is performed on each of the data transmission paths.

9. The memory device of claim 1, wherein the each of the first input path and the second input path comprises a receiver or an amplifier.

10. The memory device of claim 1, wherein the tree circuit comprises a buffer, an inverter, a delay component or a combination of the above.

11. The memory device of claim 1, wherein the adjustable delay circuit comprises an inverter chain, a phase mixer or a combination of the above.

12. The memory device of claim 1, further comprising a plurality of pass gates each connected between the training circuit and the first input, between the training circuit and the second input, between the external data strobe signal source and the first input and between the external data signal source and the second input.

13. A memory device, comprising:

a training circuit;

a data strobe transmission path comprising a first input path having a first input connected to the training circuit and an external data strobe signal source;

a plurality of data transmission paths each comprising:

a second input path having a second input connected to the training circuit and an external data signal source; and an adjustable delay circuit connected to a second output of the second input path;

a plurality of data latching circuits each connected to an output of the adjustable delay circuit of one of the data transmission paths and a first output of the first input path; and a plurality of phase detection circuits each connected to the adjustable delay circuit of one of the data transmission paths and each disposed in a straight path formed by connecting the phase detection circuits and an output of the second input path in series;

wherein when the memory device is under a training mode, a training process is performed on each of the data transmission paths such that the training circuit is activated to generate a training clock signal to the first input path to generate a first clock signal and to the second input path and further to the adjustable delay circuit to generate a second clock signal, wherein each of the phase detection circuit detects a phase difference between the first clock signal received from the first output of the first input path and the second clock signal received from the adjustable delay circuit of one of the data transmission paths to adjust a delay time of the adjustable delay circuit until the first clock signal and the second clock signal are in phase;

wherein when the memory device is under an operation mode, the training circuit is deactivated such that the first input path receives an external data strobe signal to generate a data strobe signal and the second input path receives an external data signal to generate a data signal to the adjustable delay circuit, wherein each of the data latching circuits receives a passed data strobe signal from the straight path to latch a delayed data signal received from the adjustable delay circuit.

* * * * *